United States Patent
Daiber

(10) Patent No.: US 9,054,480 B2
(45) Date of Patent: Jun. 9, 2015

(54) SMALL PACKAGED TUNABLE TRAVELING WAVE LASER ASSEMBLY

(71) Applicant: Emcore Corporation, Albuquerque, NM (US)

(72) Inventor: Andrew John Daiber, Emerald Hills, CA (US)

(73) Assignee: NeoPhotonics Corporation, San Jose, CA (US)

( * ) Notice: Subject to any disclaimer, the term of this patent is extended or adjusted under 35 U.S.C. 154(b) by 0 days.

(21) Appl. No.: 14/518,943

(22) Filed: Oct. 20, 2014

(65) Prior Publication Data

US 2015/0036704 A1 Feb. 5, 2015

Related U.S. Application Data

(63) Continuation-in-part of application No. 13/774,309, filed on Feb. 22, 2013, now Pat. No. 8,923,348, which is a continuation-in-part of application No. 13/080,519, filed on Apr. 5, 2011, now Pat. No.

(Continued)

(51) Int. Cl.
| | |
|---|---|
| *H01S 3/10* | (2006.01) |
| *H01S 5/00* | (2006.01) |
| *H01S 5/14* | (2006.01) |

(52) U.S. Cl.
CPC .............. *H01S 5/0078* (2013.01); *H01S 5/14* (2013.01)

(58) Field of Classification Search
CPC ....... H01S 5/0078; H01S 3/10; H01S 5/0064; H01S 5/005; H01S 5/02438; H01S 5/02284; H01S 5/02248

USPC ............................ 356/451; 372/26, 34, 98, 20
See application file for complete search history.

(56) References Cited

U.S. PATENT DOCUMENTS

| | | | |
|---|---|---|---|
| 5,319,659 | A | 6/1994 | Hohimer |
| 5,459,747 | A | 10/1995 | Takiguchi et al. |
| 5,579,327 | A | 11/1996 | Ohtateme et al. |
| 5,592,503 | A | 1/1997 | Welch et al. |
| 6,137,814 | A | 10/2000 | Brosson et al. |
| 6,240,312 | B1 | 5/2001 | Alfano et al. |

(Continued)

FOREIGN PATENT DOCUMENTS

EP 0687045 A2 12/1995

OTHER PUBLICATIONS

U.S. Appl. No. 13/567,307, filed Aug. 6, 2012, He et al.

(Continued)

*Primary Examiner* — Tuan Nguyen
(74) *Attorney, Agent, or Firm* — Mueting, Raasch & Gebhardt, P.A.

(57) ABSTRACT

A tunable laser configured in a small package coupled to a printed circuit board. The tunable laser includes a housing with a volume formed by exterior walls. An electrical input interface is positioned at the first end of the housing. An optical output interface is positioned at the second end of the housing and configured to transmit a continuous wave optical beam. A semiconductor optical amplifier or gain chip produces an optical output beam, and an optical isolator is positioned directly downstream of the gain chip to prevent the incoming light from the downstream optics from reflecting back though the isolator and into the cavity of the laser. A beam splitter directs a portion of the light transmitted through the isolator back into the other end of the gain chip.

10 Claims, 3 Drawing Sheets

Related U.S. Application Data 8,462,823, which is a continuation-in-part of application No. 12/722,825, filed on Mar. 12, 2010, now abandoned, which is a continuation-in-part of application No. 12/537,026, filed on Aug. 6, 2009, now abandoned.

(60) Provisional application No. 61/444,362, filed on Feb. 18, 2011.

(56) References Cited

U.S. PATENT DOCUMENTS

| | | |
|---|---|---|
| 6,295,308 B1 | 9/2001 | Zah |
| 6,665,321 B1 | 12/2003 | Sochava et al. |
| 6,822,981 B2 | 11/2004 | Jacquet |
| 6,853,654 B2 | 2/2005 | McDonald et al. |
| 6,917,288 B2 | 7/2005 | Kimmel et al. |
| 6,941,077 B2 | 9/2005 | Aronson et al. |
| 6,952,531 B2 | 10/2005 | Aronson et al. |
| 6,957,021 B2 | 10/2005 | Aronson et al. |
| 6,990,324 B2 | 1/2006 | Laroia et al. |
| 7,050,720 B2 | 5/2006 | Aronson et al. |
| 7,058,310 B2 | 6/2006 | Aronson et al. |
| 7,079,775 B2 | 7/2006 | Aronson et al. |
| 7,149,430 B2 | 12/2006 | Hosking et al. |
| 7,162,160 B2 | 1/2007 | Aronson et al. |
| 7,184,668 B2 | 2/2007 | Aronson et al. |
| 7,200,337 B2 | 4/2007 | Hosking et al. |
| 7,257,142 B2 | 8/2007 | Sochava et al. |
| 7,302,186 B2 | 11/2007 | Light et al. |
| 7,346,278 B2 | 3/2008 | Aronson et al. |
| 7,710,581 B2 | 5/2010 | Harker |
| 7,771,071 B2 | 8/2010 | Finot et al. |
| 7,794,157 B2 | 9/2010 | Hudgins et al. |
| 7,961,374 B2 | 6/2011 | Finot et al. |
| 8,462,823 B2 | 6/2013 | Daiber et al. |
| 2002/0054614 A1 | 5/2002 | Jin |
| 2002/0071458 A1 | 6/2002 | Iwafuji |
| 2002/0131466 A1 | 9/2002 | Salvatore et al. |
| 2003/0053170 A1 | 3/2003 | Levinson et al. |
| 2003/0086448 A1 | 5/2003 | Deacon |
| 2003/0095311 A1 | 5/2003 | Liu et al. |
| 2003/0161570 A1 | 8/2003 | Paniccia |
| 2004/0071181 A1 | 4/2004 | Huang |
| 2004/0100686 A1* | 5/2004 | Flanders et al. .......... 359/341.1 |
| 2004/0101016 A1* | 5/2004 | McDonald et al. .......... 372/97 |
| 2004/0197101 A1 | 10/2004 | Sasser et al. |
| 2005/0025500 A1 | 2/2005 | Hallemeier et al. |
| 2005/0074039 A1 | 4/2005 | Kuramachi et al. |
| 2005/0196111 A1 | 9/2005 | Burdick et al. |
| 2005/0213618 A1 | 9/2005 | Sochava et al. |
| 2006/0045525 A1 | 3/2006 | Lee et al. |
| 2006/0072634 A1 | 4/2006 | Daiber |
| 2006/0133819 A1 | 6/2006 | Yu et al. |
| 2007/0092257 A1 | 4/2007 | Smith et al. |
| 2007/0140690 A1 | 6/2007 | Aronson et al. |
| 2007/0263713 A1 | 11/2007 | Aronson |
| 2008/0166131 A1 | 7/2008 | Hudgins et al. |
| 2008/0298810 A1 | 12/2008 | Crosby et al. |
| 2009/0119686 A1 | 5/2009 | Monroe |
| 2011/0032955 A1 | 2/2011 | Daiber |
| 2011/0033192 A1 | 2/2011 | Daiber et al. |
| 2011/0110388 A1 | 5/2011 | Baroni et al. |
| 2011/0182305 A1 | 7/2011 | Daiber et al. |
| 2013/0177034 A1 | 7/2013 | Liu et al. |

OTHER PUBLICATIONS

Akulova et al., "10 Gb/s Mach-Zehnder modulator integrated with widely-tunable sampled grating DBR Laser," Optical Fiber Communication Conference, 2004; 3 pgs.

European Search Report dated Jun. 4, 2014 for European Patent No. 2770590 A1; 3 pgs.

Griffin et al., "Compact, High Power, MQW InP Mach-Zehnder Transmitters with Full-band Tunability for 10 Gb/s DWDM," *ECOC Proceedings*, 2005; 4:903-904.

* cited by examiner

SMALL PACKAGED TUNABLE TRAVELING WAVE LASER ASSEMBLY

REFERENCE TO RELATED APPLICATIONS

The present application is a continuation-in-part of U.S. patent application Ser. No. 13/774,309, filed Feb. 22, 2013, now U.S. Pat. No. 8,923,348 which in turn is a continuation-in-part of U.S. patent application Ser. No. 13/080,519, filed Apr. 5, 2011, now U.S. Pat. No. 8,462,823, which claims priority to provisional application No. 61/444,362, filed Feb. 18, 2011, and in turn is also a continuation-in-part of U.S. patent application Ser. No. 12/722,825, filed Mar. 12, 2010, which in turn is a continuation-in-part of U.S. patent application Ser. No. 12/537,026, filed Aug. 6, 2009, each of which applications is incorporated by reference herein in its entirety.

FIELD OF THE INVENTION

The present application is directed to a tunable laser and, more particularly, to a small, packaged tunable laser assembly including a semiconductor optical amplifier having a first and a second facet in which a portion of the light emitted from the first facet is directed into the second facet.

BACKGROUND

Tunable lasers may be packaged as a component of an optical transceiver, or may be used in other applications outside of an optical transceiver. Tunable lasers are generally packaged with other components including an electrical interface and an optical interface.

There is an ever-constant challenge in the industry to reduce the size of tunable laser packages. The reduction in size may allow lasers to be used in a greater number of applications. The reduction in size provides numerous design challenges for the package components to fit within the limited space and also not compromise performance or reliability.

In applications in which tunable lasers are a component of an optical transceiver, the tunable lasers should be sized for use with one of the various form factors. The various form factors provide standardized dimensions and electrical input/output interfaces that allow devices from different manufacturers to be used interchangeably. Examples of form factors include but are not limited to XENPAK, SFF ("Small Form Factor"), SFP ("Small Form Factor Pluggable"), XFP ("10 Gigabit Small Form Factor Pluggable"), ITLA ("Integrable Tunable Laser Assembly"), and the micro-ITLA ("micro-Integrable Tunable Laser Assembly").

Therefore, there is a need for a small, packaged tunable laser and assembly for various applications.

SUMMARY

The present application is directed to tunable lasers configured in a small package. The tunable lasers may include a rectangular housing, an electrical input interface, an optical output interface, a tunable semiconductor laser and a focusing lens assembly. The rectangular housing has a volume of less than 0.6 cubic centimeters, with six planar exterior walls including a bottom, a top, opposing first and second ends, and opposing sidewalls. The exterior walls form a hermetically sealed interior space that includes a major axis that extends through the first and second ends. The electrical input interface is positioned at the first end of the housing and aligned with the major axis. The optical output interface is positioned at the second end of the housing and aligned with the major axis. The optical interface is configured to transmit a continuous wave (CW) optical beam. The tunable semiconductor laser is positioned in the interior space and operable to emit a laser beam having a selectable wavelength that may be adjusted by an electrical input signal to the laser. The focusing lens assembly is positioned in the interior space along an optical path of the laser beam to operatively couple the laser beam to the optical output interface.

Briefly, and in general terms, the present disclosure provides a small, packaged tunable laser comprising a rectangular housing having a volume of less than 0.6 cubic centimeters, with six planar exterior walls including a bottom, a top, opposing first and second ends, and opposing sidewalls, the exterior walls forming a hermetically sealed interior space that includes a major axis that extends through the first and second ends; an electrical input interface positioned on the exterior of the housing; an optical output interface positioned on the exterior of the housing and aligned with the major axis, the optical output interface configured to transmit a continuous wave optical beam; a tunable semiconductor laser including a gain chip or semiconductor optical amplifier positioned in the interior space and operable to emit a laser beam having a selectable wavelength; an optical isolator positioned in the interior space of the housing and in the path of the output beam directly downstream of the gain chip to prevent the reflecting light from the downstream optical elements from reflecting back though the isolator and into the cavity of the laser; a beam splitter positioned in the interior space of the housing and in the path of the laser beam from the optical isolator for producing a first beam, and a second beam; a tunable filter in the interior space of the housing and disposed in the path of the second beam; and coupling optics in the interior space of the housing and downstream of the beam splitter for coupling the second beam to the optical output interface.

In some embodiments, the beam splitter couples 85 to 95% of the incoming light to the optical output interface.

In some embodiments, the beam splitter couples about 90% of the incoming light to the optical output interface.

In some embodiments, the tunable filter comprises a Vernier tuning mechanism including respective first and second optical filters having respective sets of transmission peaks having slightly different free spectral ranges and similar finesses, and wherein tuning is performed by shifting the set of transmission peaks of the second optical filter relative to the set of transmission peaks of the first optical filter to align a single transmission peak of each of the first and second sets of transmission peaks.

In some embodiments, there further comprises a base in the interior of the housing; a structure operatively coupled to the base, having a front facet and a substantially non-reflective rear facet optically coupled via a waveguide passing therethrough, the structure further including: a gain section to emit a plurality of photons in response to a first electrical input, having a facet defining the rear facet of the structure.

In some embodiments, the optical path is aligned along the major axis of the housing.

In some embodiments, the coupling optics includes a focusing lens.

In some embodiments, there further comprises a cavity length actuator positioned in the interior space along an optical path of the beam downstream from the first optical filter and along the optical path of the beam emitted from the first optical filter and functioning to adjust and lock an optical pathlength of the external cavity tunable laser.

In some embodiments, the cavity length actuator is a block of silicon having a planar surface tilted with respect to the optical axis to prevent the incoming light from the laser from reflecting back into the cavity of the laser.

In some embodiments, the cavity length actuator is disposed between the first and second optical filters of the Vernier tuning mechanism, and further includes an anti-reflection coating on its planar surface.

In some embodiments, a thermoelectric cooler is positioned within the interior space between the bottom of the housing and at least one of the tunable semiconductor laser and the coupling optics.

In some embodiments, the electrical input interface includes a row of pins extending from the housing to enable an electrical connector to be coupled thereto.

The present invention is not limited to the above features and advantages. Those skilled in the art will recognize additional features and advantages upon reading the following detailed description, and upon viewing the accompanying drawings.

DETAILED DESCRIPTION

Figure 1:
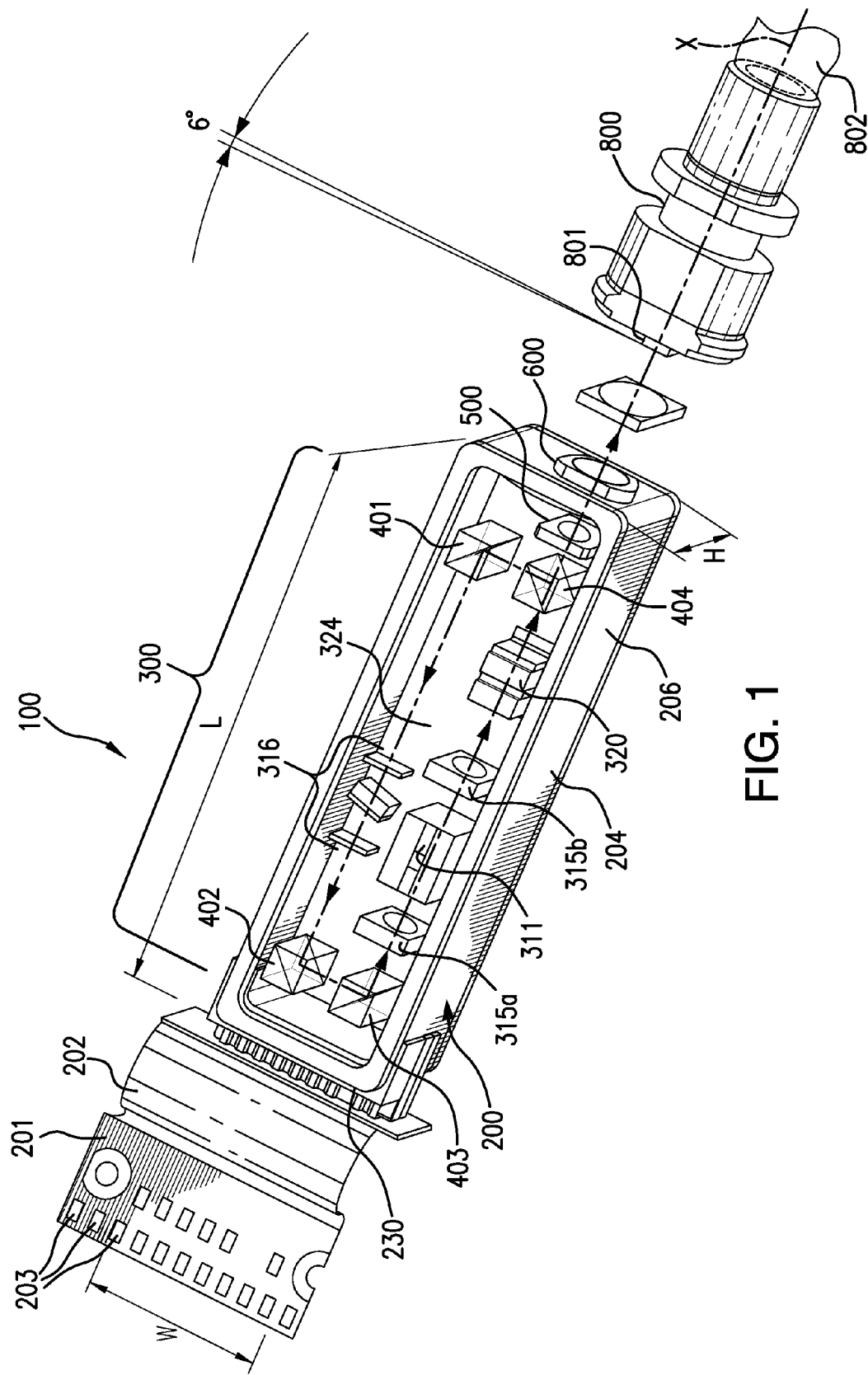
FIG. 1 is a top perspective view of the small, packaged tunable laser subassembly according to one embodiment of the present disclosure.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The present application is directed to a small, packaged tunable laser 100 as illustrated in one embodiment in FIG. 1.

The tunable laser 100 is packaged in a housing 200 that forms an interior space for housing the laser components 300. The laser 100 is packaged in housing which is particularly small and compact in size which makes it especially suitable for use in pluggable optical transceivers and various other module configurations or applications. In the present disclosure, the laser 100 is coupled to a printed circuit board which includes circuitry for laser function control and an electrical and mechanical interface for mounting the packaged subassembly on a customer's transmitter platform or other assembly.

The housing 200 includes a generally rectangular body 206 with exterior walls that forms a substantially rectangular shape. The body 206 includes a bottom 204, a cover (not illustrated), first and second ends 230, 231, and opposing sidewalls 232, 233. The cover may be substantially planar and positioned on the top surfaces of the first and second ends 230, 231 and opposing sidewalls 232, 233. In one embodiment, the cover is substantially identical to the bottom 204.

The housing 200 includes a substantially rectangular shape with a width W formed by the opposing sidewalls 232, 233, a length L formed by the first and second ends 230, 231, and a height H that extends between the bottom 204 and top of the sidewalls 232, 233 and ends 230, 231. The housing 200 may include various sizes. In one specific embodiment, the width W is about 5.4 mm, the length L is about 17.1 mm, and the height H is about 5.9 mm. The volume of the interior space formed by the housing 200 may also vary depending upon the application. Exemplary volumes may range from between about 400 $mm^3$ to about 600 $mm^3$. In one specific embodiment, the volume is about 545 $mm^3$. The housing 200 includes an elongated shape with a major axis X extending along the length L through the first and second ends 230, 231, and a minor axis Y perpendicular to the major axis and extending through the opposing sidewalls 232, 233. The housing 200 may be hermetically sealed to protect the laser components 300 from humidity and other environmental conditions.

On the first end 230 of the housing 200 is an electrical interface 202 which in one embodiment is configured as two parallel rows of pins 205 and 206 respectively. The electrical interface 202 is configured to receive power and control information-containing electrical signals, such as a signal to adjust the wavelength of the laser, or other characteristics of the output laser beam.

An optical output interface 800 extends outward from the second end 231 of the housing 200. In one embodiment, the optical output interface 800 is an optical fiber ferrule or "pigtail" aligned with the major axis X of the housing 200. The optical output interface 800 is configured to transmit a continuous wave optical beam that is emitted from the laser components 300 over an optical fiber contained within the interface.

The laser components 300 generally include an external cavity laser and coupling optics 320. The external cavity laser 310 includes a first subassembly including a diode gain chip or semiconductor optical amplifier 311 comprising a Fabry-Perot diode laser with a substantially non-reflective front facet and a highly reflective rear facet. The gain chip 311 may also include a curved-waveguide structure as more particularly described in U.S. patent application Ser. No. 13/567,307, filed Aug. 6, 2012, which is hereby incorporated by reference in its entirety. The first subassembly also includes a collimating lens 314 and a steering lens 315 in the path of the beam emitted from the gain chip 311. The collimating lens 314 and the steering lens 315 are both mounted on the same base as the gain chip 311.

A beam splitter 404 is provided downstream of the optical isolator 320. The beam splitter transmits 85 to 95% of the incoming light to downstream collimating lens 500.

The external cavity laser 310 further includes a second subassembly including a tunable filter 316 (including tunable filter elements 316a and 316b), a cavity length actuator 317 disposed between the tunable filter elements 316a and 316b, and a reflective element 319.

Possible implementations of the tunable filter 316 include but are not limited to Bragg gratings, Fabry-Perot etalons, and liquid crystal waveguides. In one embodiment, the tunable filter 316 includes a pair of spaced apart tunable elements or etalons 316a, 316b. The etalons 316a, 316b are Fabry-Perot spaced etalons that are positioned in a parallel configuration. The first etalon 316a includes a thickness measured between opposing faces and a refractive index according to the material from which it is constructed. The second etalon 316b includes a thickness measured between its opposing faces and a refractive index according to the material from which it is constructed. The etalons 316a, 316b may be constructed from the same or different materials, and may include the same or different thicknesses. Etalons 316a, 316b may be constructed from various materials, such as but not limited to silicon and gallium arsenide. One or both etalons 316a, 316b are tunable by a temperature-induced change in their refractive indexes and/or a temperature-induced change in their thickness. In one embodiment, the etalons 316a, 316b are tunable by simultaneous control of both the refractive index and the physical thickness.

In one embodiment, the tunable filter 316 utilizes a Vernier tuning mechanism including respective first and second optical filters 316a, 316b having respective sets of transmission peaks having slightly different free spectral ranges and similar finesses. Tuning is performed by shifting the set of transmission peaks of the second optical filter 316b relative to the set of transmission peaks of first optical filter 316a to align a single transmission peak of each of the first and second sets of transmission peaks.

The actuator 317 may be a block of silicon which is polished and anti-reflection coated, and is disposed between etalons 316a and 316b. In some embodiments the actuator 317 may use thermal, mechanical, or electro-optical mechanisms to adjust the optical pathlength of the laser cavity. In some embodiments the actuator 317 is oriented in the cavity with a seven degree tilt with respect to the optical axis of the beam directed to it from etalon 316a, so that the light circulating in the optical cavity does not reflect back into the cavity regardless of the efficacy of the anti-reflection coating. The actuator 317 may also lock the optical path length. Instead of, or in addition to, an anti-reflection coating on the actuator 317, a band-pass filter may be implemented on its planar surface.

The external cavity tunable laser 310 may be configured with the tunable filter 316a/316b being decoupled from the gain chip 311. This configuration results in the tunable filter 316a/316b being very stable and therefore does not require an external wavelength locker as required in Distributed Feedback (DFB) lasers and Distributed Bragg Reflector (DBR) lasers. Other advantages of the external cavity tunable laser 310 over these other lasers are the extremely narrow linewidth and very high side mode suppression ratio.

The coupling optics 320 provide isolation and coupling to the optical output interface 801. The coupling optics 320 efficiently couple light from the gain chip 311 to the optical output interface 801. The external cavity lenses 314, 315 are chosen to correct for the difference between mode field diameters of the gain chip 311 and the optical fiber 802.

The beam splitter 401 is disposed in the interior of the housing and directs the incoming beam to the tunable filter 316.

The positioning of the optical isolator 324 directly downstream is one of the features of the embodiment of the present disclosure that distinguishes it from the parent applications U.S. patent application Ser. No. 13/774,309 filed Feb. 22, 2013, and No. 13/080,519, filed Apr. 5, 2011. Experimental data has shown that the positioning of the optical isolator 324 upstream of the beam splitter 401 may result in a noisy feedback signal, which for many applications and operational conditions is undesirable.

The coupling optics 320 includes an optical isolator 324 disposed directly downstream of the beam splitter 401. The optical isolator 324 may include a two-stage isolator that prevents light reflected from coupling optics 320 from getting back through the beam splitter and into the external cavity tunable laser 310. The isolator 324 may also rotate a light polarization by 90 degrees to improve transmission. In one embodiment, the optical path is aligned substantially along the major axis X of the housing 200.

In some embodiments, the isolator 324 is mounted on a piezoelectric transducer (PZT) 325. The PZT 325 functions to provide dithering during frequency tuning, which enables locking onto the target frequency more rapidly. The PZT in turn is mounted on the sled or circuit board which has traces thereon that provide the electrical connection to the PZT 325.

The coupling optics 320 directly downstream of the optical isolator 324 is a single-piece integral collimating lens 500 including a concave first surface 501 and a convex second surface 502. Downstream from the collimating lens 500 is a window 600 which is attached to the housing 200 and permits the collimated beam to exit the housing 200. Outside of the housing 200 and coupled to the collimated beam is the optical output interface, which includes a fiber focus alignment lens 700 and the optical fiber ferrule 800. In the embodiment depicted, the cladded optical fiber 802 is a "pig-tail" that extends for a relatively short distance to allow coupling to other subassemblies. In another embodiment (not depicted), the window 600 or the alignment lens 700 may be the final downstream components associated with the housing 200, to allow the user to couple an optical fiber directly to the outside of the housing 200 through a pluggable connector or other optical interface.

In some embodiments, the end portion of the ferrule 800 includes a polarizer 801 which has a planar entry end face which is inclined at an angle of about six (6) degrees from a plane which is normal to the incoming central beam from the lens 700. The inclination of the plane is provided to prevent reflections of the incoming beam from the surface of the planar entry end face from going back into the lens 700 and back through the coupling optics 800 into the laser cavity.

A thermoelectric cooler includes first and second plates 702 and 704, respectively, separated by intermediate members 703a, 703b, 703c, etc., that provides a base for supporting the various elements of the tunable laser 100. In one embodiment, the thermoelectric cooler (comprised of elements 702, 703, 704) is positioned between the bottom 204 of the housing 200 and one or more of the laser components 300. The plates 702, 704 may be constructed from a variety of materials, including ceramics. The intermediate members 703a, 703b, etc., each include a first end operatively connected to the first plate 702 and a second end operatively connected to the second plate 704. The intermediate members 703a, 703b, etc. are electrically connected in series by connectors. The intermediate members 703a, 703b, etc., are constructed from semiconductor material that allows for electron flow through the member 703a, 703b, etc. when connected to a DC power source. In use, as the DC power source is activated and a current passes through the series of intermediate members 703a, 703b, etc., the current causes a decrease in temperature at the first plate 702 that absorbs heat from the laser components 300. The heat is transferred through the plate 702 and intermediate members 703a, 703b, etc., into the second plate 704. This heat may then be transferred from the second plate 704, such as to a heat sink.

Likewise, the temperature of the tunable filter 316 and cavity length actuator 317 may be separately controlled from the other laser components 300. A bench 318, which may be composed of a glass, may provide thermal isolation from the thermoelectric cooler 400.

One example of a tunable laser is disclosed in U.S. Pat. No. 7,257,142, herein incorporated by reference. Such patent describes what may be called an "integrated design" in contrast with an arrangement of discrete components such as described in the present disclosure.

Figure 2:
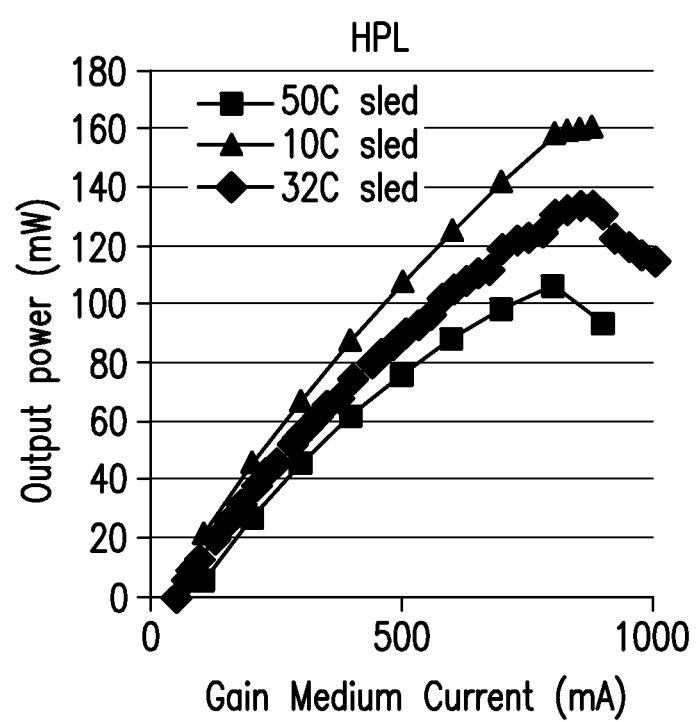
FIG. 2 is a graph depicting the output power of the laser subassembly of the present disclosure as a function of the current in the gain medium.

FIG. 2 is a graph depicting the output power of the present disclosure as a function of the current in the gain medium. Since the output varies with the temperature of the support or sled on which the laser subassembly is mounted, the graph presents three different temperatures 10 degrees C., 32 degrees C., and 50 degrees C.

Figure 3:
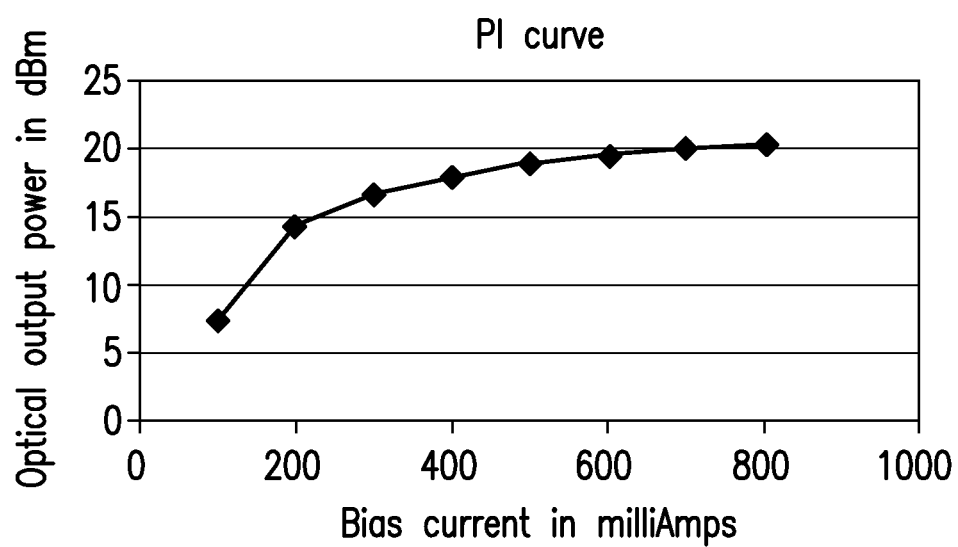
FIG. 3 is a more detailed graph depicting the output power in dBm of the laser subassembly of the present disclosure as a function of the bias current applied to the gain medium.

FIG. 3 is a more detailed graph depicting the output power in dBm of the laser subassembly of the present disclosure as a function of the bias current applied to the gain medium, showing the substantially improved output power approaching 20 dBm.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The present invention may be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A small, packaged tunable laser comprising:
    a rectangular housing having a volume of less than 0.6 cubic centimeters, with six planar exterior walls including a bottom, a top, opposing first and second ends, and opposing sidewalls, the exterior walls forming a hermetically sealed interior space that includes a major axis that extends through the first and second ends;
    an electrical input interface positioned on the exterior of the housing;
    an optical output interface positioned on the exterior of the housing and aligned with the major axis, the optical output interface configured to transmit a continuous wave optical beam;
    a semiconductor optical amplifier positioned in the interior space having a first end portion, and a second end portion, the second end portion being operable to emit a laser beam having a predetermined wavelength;
    an optical isolator positioned in the interior space of the housing and in the path of the laser beam downstream of the optical amplifier to prevent the light from the downstream optical elements from reflecting back into the cavity of the laser;
    a first beam splitter positioned in the interior space of the housing downstream of the optical isolator and in the path of the laser beam for producing a first optical beam and a second optical beam;
    coupling optics in the interior space of the housing and downstream of the first beam splitter for coupling the first optical beam to the optical output interface; and
    tunable filter having an input end, in the path of the second optical beam and an output end, the output beam emitted from the output end being coupled to the first end portion of the semiconductor optical amplifier.

2. The tunable laser of claim 1, wherein the gain chip and the tunable filter form a tunable semiconductor and wherein the optical path of the first optical beam is aligned along the major axis of the housing.

3. The tunable laser of claim 1, wherein the tunable filter comprises a Vernier tuning mechanism including respective first and second optical filters having respective sets of transmission peaks having slightly different free spectral ranges and similar finesses, and wherein tuning is performed by shifting the set of transmission peaks of the second optical filter relative to the set of transmission peaks of the first optical filter to align a single transmission peak of each of the first and second sets of transmission peaks.

4. The tunable laser of claim 3, further including a cavity length actuator positioned in the interior space along an optical path of the beam downstream from the first optical filter and along the optical path of the beam emitted from the first optical filter and functioning to adjust and lock an optical pathlength of the external cavity tunable laser.

5. The tunable laser of claim 4, wherein the cavity length actuator is a block of silicon having a planar surface tilted with respect to the optical axis to prevent the incoming light from the laser from reflecting back into the cavity of the laser.

6. The tunable laser of claim 3, further comprising a cavity length actuator disposed between the first and second optical filters of the Vernier tuning mechanism, and further including an anti-reflection coating or band pass filter on its planar surface.

7. The tunable laser of claim 1, further comprising a base in the interior of the housing; a structure operatively coupled to the base, having a front facet and a substantially non-reflective rear facet optically coupled via a waveguide passing therethrough, the structure further including a gain section to emit a plurality of photons in response to a first electrical input, and having a facet defining the rear facet of the structure.

8. The tunable laser of claim 7, further including a thermoelectric cooler positioned within the interior space between the bottom of the housing and at least one of the tunable semiconductor laser and the coupling optics.

9. The tunable laser of claim 1, further comprising a piezoelectric transducer coupled to the optical isolator.

10. The tunable laser of claim 1, further comprising a ferrule having an entry aperture disposed adjacent to the coupling optics, wherein the entry aperture has a planar face which is inclined at an angle of from five to seven degrees from a plane which is normal to the incoming central beam from the coupling optics so as to prevent reflections of the incoming beam from the surface of the planar entry end face from going back into the coupling optics.

* * * * *